United States Patent
Xu et al.

(10) Patent No.: US 12,284,870 B2
(45) Date of Patent: Apr. 22, 2025

(54) OLED DISPLAY PANEL AND DISPLAY DEVICE

(71) Applicants: Beijing BOE Display Technology Co., Ltd., Beijing (CN); BOE Technology Group Co., Ltd., Beijing (CN)

(72) Inventors: Chuanxiang Xu, Beijing (CN); Shi Shu, Beijing (CN); Qi Yao, Beijing (CN); Guangcai Yuan, Beijing (CN); Yang Yue, Beijing (CN); Haitao Huang, Beijing (CN); Yong Yu, Beijing (CN)

(73) Assignees: Beijing BOE Display Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/416,405

(22) Filed: Jan. 18, 2024

(65) Prior Publication Data

US 2024/0155867 A1    May 9, 2024

Related U.S. Application Data

(63) Continuation of application No. 16/977,516, filed as application No. PCT/CN2019/119775 on Nov. 20, 2019, now Pat. No. 11,974,459.

(51) Int. Cl.
  *H10K 50/86*    (2023.01)
  *G06F 3/041*    (2006.01)
  (Continued)

(52) U.S. Cl.
  CPC ......... *H10K 50/865* (2023.02); *G06F 3/0412* (2013.01); *H10K 50/844* (2023.02);
  (Continued)

(58) Field of Classification Search
  CPC .................................................. H10K 50/865
  See application file for complete search history.

(56) References Cited

U.S. PATENT DOCUMENTS

| | | | |
|---|---|---|---|
| 9,786,721 B1 | 10/2017 | Tang | |
| 2004/0017153 A1 | 1/2004 | Nishikawa | |

(Continued)

FOREIGN PATENT DOCUMENTS

| | | | |
|---|---|---|---|
| CN | 103235439 A | 8/2013 | |
| CN | 104008779 A | 8/2014 | |

(Continued)

OTHER PUBLICATIONS

Office Action received for Korean Republic Patent Application No. 10-2022-7006637, mailed on Mar. 11, 2024, 15 pages (7 pages of English Translation and 8 pages of Original Document).

(Continued)

*Primary Examiner* — Douglas M Menz
(74) *Attorney, Agent, or Firm* — ArentFox Schiff LLP; Michael Fainberg

(57) ABSTRACT

The present application relates to the technical field of display, and discloses an OLED display panel and a display device. The OLED display panel includes a drive backplane; and an OLED device, an encapsulation structure and a color resistor structure which are arranged on the drive backplane; the encapsulation structure and the color resistor structure are located on a side, facing away from the drive backplane, of the OLED device, and the color resistor structure includes a chromatic color resistor layer, a first BM and a second BM; and the first BM is located on a side, facing away from the drive backplane, of the chromatic color resistor layer, and the second BM is located on a side, facing the drive backplane, of the chromatic color resistor layer.

18 Claims, 5 Drawing Sheets

(51) Int. Cl.
*H10K 50/844* (2023.01)
*H10K 50/854* (2023.01)
*H10K 59/38* (2023.01)
*H10K 59/40* (2023.01)

(52) U.S. Cl.
CPC .......... *H10K 50/854* (2023.02); *H10K 59/38* (2023.02); *H10K 59/40* (2023.02)

(56) References Cited

U.S. PATENT DOCUMENTS

| | | |
|---|---|---|
| 2006/0220509 A1 | 10/2006 | Ghosh et al. |
| 2007/0103056 A1* | 5/2007 | Cok .................. H10K 59/879 313/506 |
| 2010/0124045 A1 | 5/2010 | Kato |
| 2012/0044133 A1 | 2/2012 | Nakamizo et al. |
| 2013/0284354 A1 | 10/2013 | Lee et al. |
| 2015/0318447 A1 | 11/2015 | Choi |
| 2015/0348646 A1 | 12/2015 | Wang et al. |
| 2016/0211311 A1 | 7/2016 | Sato et al. |
| 2016/0372023 A1 | 12/2016 | Zhang et al. |
| 2017/0033318 A1 | 2/2017 | Wu et al. |
| 2017/0062528 A1 | 3/2017 | Aoyama et al. |
| 2017/0213872 A1 | 7/2017 | Jinbo et al. |
| 2018/0122868 A1 | 5/2018 | Kim et al. |
| 2018/0144702 A1 | 5/2018 | Furuta et al. |
| 2018/0182818 A1 | 6/2018 | Kim |
| 2018/0197921 A1 | 7/2018 | Kim et al. |
| 2019/0067391 A1 | 2/2019 | Li et al. |
| 2019/0198573 A1 | 6/2019 | Kim et al. |
| 2019/0304374 A1 | 10/2019 | Wang et al. |
| 2020/0005698 A1 | 1/2020 | Dai et al. |
| 2020/0035748 A1 | 1/2020 | Xia et al. |
| 2020/0058888 A1 | 2/2020 | Sugiyama et al. |
| 2020/0258944 A1 | 8/2020 | Joo et al. |
| 2020/0312916 A1 | 10/2020 | Kim et al. |
| 2021/0043873 A1 | 2/2021 | Sung et al. |
| 2021/0375999 A1 | 12/2021 | Xu et al. |

FOREIGN PATENT DOCUMENTS

| | | |
|---|---|---|
| CN | 104616616 A | 5/2015 |
| CN | 105098095 A | 11/2015 |
| CN | 205900543 U | 1/2017 |
| CN | 108054191 A | 5/2018 |
| CN | 108336119 A | 7/2018 |
| CN | 108933153 A | 12/2018 |
| CN | 109801577 A | 5/2019 |
| CN | 111554703 A | 8/2020 |
| EP | 3716336 A1 | 9/2020 |
| JP | 2003257662 A | 9/2003 |
| JP | 2010122520 A | 6/2010 |
| JP | 2016134293 A | 7/2016 |
| JP | 2017134402 A | 8/2017 |
| KR | 10-1114916 B1 | 2/2012 |
| KR | 10-2018-0076689 A | 7/2018 |
| KR | 20190080312 A | 7/2019 |
| KR | 20190093131 A | 8/2019 |
| KR | 20190115546 A | 10/2019 |
| WO | 2010097986 A1 | 9/2010 |
| WO | 2016190186 A1 | 12/2016 |
| WO | 2017018041 A1 | 2/2017 |

OTHER PUBLICATIONS

Corrected Notice of Allowance for U.S. Appl. No. 16/977,516 dated Apr. 3, 2024.
Extended European Search Report in EP19945455.4, mailed Feb. 8, 2023, 16 pages.
International Search Report and Written Opinion in PCT/CN2019/119775, mailed Aug. 19, 2020, 7 pages.
Notice of Allowance in U.S. Appl. No. 16/977,516, mailed Dec. 5, 2023, 8 pages.
Office Action in JP2021572592, mailed Aug. 16, 2023, 5 pages.
Office Action in JP2021572592, mailed Jan. 4, 2024, 2 pages.
Office Action in U.S. Appl. No. 16/977,516, mailed Aug. 31, 2023, 9 pages.
Partial European Search Report in EP19945455.4, mailed Nov. 11, 2022, 14 pages.

* cited by examiner

OLED DISPLAY PANEL AND DISPLAY DEVICE

This application is a continuation of U.S. patent application Ser. No. 16/977,516, filed on Sep. 2, 2020, which is a National Stage of International Application No. PCT/CN2019/119775, filed on Nov. 20, 2019. The afore-mentioned patent applications are hereby incorporated by reference in their entireties.

FIELD

The present disclosure relates to the technical field of display, in particular to an OLED display panel and a display device.

BACKGROUND

Organic light-emitting diode (OLED) has gradually begun to eat into the liquid crystal display (LCD) market because of its advantages of relatively fast response speed, thin thickness, high contrast and the like, and has become a preferred technology for flexible display devices especially due to its bendable and flexible characteristics.

Because an OLED structure contains a lot of metal, which has a relatively high reflectivity to external environment light, at present, attaching of a circular polarizer is widely adopted to lower reflection of an OLED substrate to the external environment light. After the circular polarizer is attached, a flexible touch control substrate is further generally attached, however, both of the flexible touch control substrate and the circular polarizer are thick, which will affect the flexibility and folding performance of a whole OLED module, in view of this, in order to implement a better effect of folding and reduce a bending radius, a CF on Encapsulation (COE) technology is proposed currently, that is, a chromatic color resistor layer is formed on a thin-film encapsulated light-emitting device through a low-temperature yellow light process, and the structure has effects of lowering panel reflection, improving color purity, reducing panel thickness and the like. However, when a display panel of the structure is in a screen off state (also called dark state), there is a color separation phenomenon under irradiation of a point light source and a line light source, and the cause and solution of the problem have not been clarified so far.

SUMMARY

The present application discloses an OLED display panel and a display device to relieve a color separation phenomenon of a COE OLED display panel in a dark state.

To implement the above objective, the present disclosure provides the following technical solutions:
an OLED display panel includes: a drive backplane; and an OLED device, an encapsulation structure and a color resistor structure which are arranged on the drive backplane; wherein the encapsulation structure and the color resistor structure are located on a side, facing away from the drive backplane, of the OLED device; the color resistor structure includes a chromatic color resistor layer, a first black matrix (BM) and a second BM; and the first BM is located on a side, facing away from the drive backplane, of the chromatic color resistor layer, and the second BM is located on a side, facing the drive backplane, of the chromatic color resistor layer.

Optionally, the side, facing away from the drive backplane, of the OLED device is provided with at least one scattering layer; and the at least one scattering layer includes an organic material film and scattering particles arranged in the organic material film.

Optionally, the encapsulation structure includes two inorganic insulating layers and a first organic insulating layer located between the two inorganic insulating layers; and
the first organic insulating layer is configured as the scattering layer.

Optionally, the chromatic color resistor layer is configured as the scattering layer.

Optionally, the chromatic color resistor layer includes a red color resistor, a green color resistor and a blue color resistor, wherein particle sizes of scattering particles respectively contained in the red color resistor, the green color resistor and the blue color resistor are sequentially reduced.

Optionally, the display panel further includes a second organic insulating layer located between the encapsulation structure and the color resistor structure;
wherein the second organic insulating layer is configured as the scattering layer.

Optionally, the display panel further includes a touch control structure located on a side, facing away from the drive backplane, of the encapsulation structure, wherein the touch control structure is located between the encapsulation structure and the color resistor structure, or the touch control structure is located on a side, facing away from the drive backplane, of the color resistor structure.

Optionally, the display panel further includes a third organic insulating layer located between the touch control structure and the color resistor structure, wherein the third organic insulating layer is configured as the scattering layer.

Optionally, the display panel further includes the touch control structure located on the side, facing away from the drive backplane, of the encapsulation structure, wherein the touch control structure includes two layers of touch control electrodes and a fourth organic insulating layer located between the two layers of touch control electrodes; and
the fourth organic insulating layer is configured as the scattering layer.

Optionally, the display panel further includes the touch control structure located on the side, facing away from the drive backplane, of the encapsulation structure, and a fifth organic insulating layer located on a farthest side, facing away from the drive backplane, of the touch control structure and the color resistor structure,
wherein the fifth organic insulating layer is configured as the scattering layer.

Optionally, the scattering particles are inorganic scattering particles, and the inorganic scattering particles are mixtures of one or more of titanium oxide, zirconium oxide, silicon oxide, calcium carbonate and barium sulfate.

Optionally, particle sizes of the inorganic scattering particles are 40 nm to 700 nm, and a mass percent of the inorganic scattering particles in the organic material film is 1% to 15%.

Optionally, the scattering particles are organic scattering particles, a refractive index ratio of the organic scattering particles to the organic material film is 0.7 to 0.99, and a mass percent of the organic scattering particles in the organic material film is 5% to 40%.

Optionally, the display panel includes the touch control structure, wherein the touch control structure is located on a side, facing away from the drive backplane, of the color resistor structure;

wherein the display panel further includes: a third BM located on the side, facing away from the drive backplane, of the touch control structure.

Optionally, the OLED device includes a first electrode layer electrically connected with the drive backplane, and a surface of a side, facing away from the drive backplane, of the first electrode layer is a rough surface.

Optionally, the drive backplane includes a flat layer facing the OLED device;
the first electrode layer of the OLED device is arranged on the flat layer; and
a surface of the flat layer is configured as a rough surface to make the surface of the first electrode layer prepared on the flat layer rough.

Optionally, the flat layer includes two film layers.

Optionally, the flat layer is made of materials of a silicon-on-glass (SOG) series, an acrylic acid series and an epoxy resin series.

A display device includes the OLED display panel according to any one of the above.

DETAILED DESCRIPTION OF THE EMBODIMENTS

Technical solutions in embodiments of the present disclosure will be described clearly and completely below in conjunction with accompanying drawings in the embodiments of the present disclosure. Apparently, the described embodiments are only part of the embodiments of the present disclosure, not all of the embodiments. Based on the embodiments in the present disclosure, all other embodiments obtained by those of ordinary skill in the art without creative labor are within the scope of protection in the present disclosure.

Figure 2:
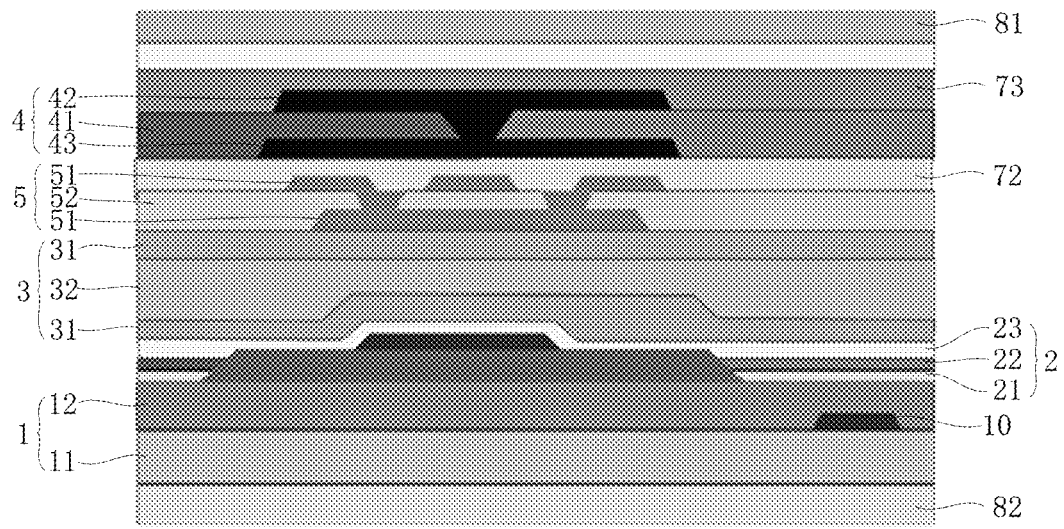
FIG. 2 is a schematic cross-sectional structural diagram of a display panel according to an embodiment of the present disclosure.
Figure 7:
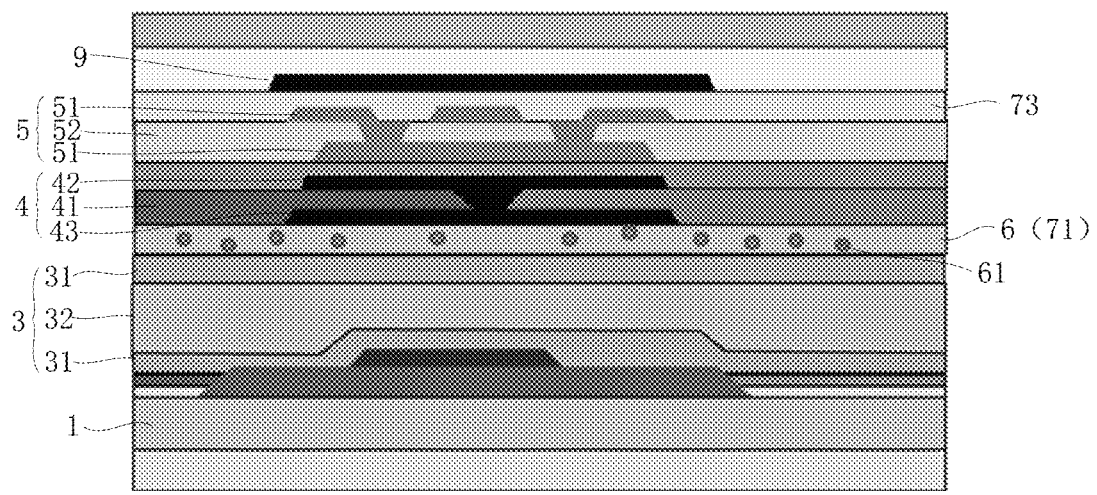
FIG. 7 is a schematic cross-sectional structural diagram of a display panel according to another embodiment of the present disclosure.

As shown in FIG. 2 and FIG. 7, the embodiment of the present disclosure provides an OLED display panel, including a drive backplane 1, and an OLED device 2, an encapsulation structure 3 and a color resistor structure 4, wherein the OLED device 2, the encapsulation structure 3 and the color resistor structure 4 are arranged on the drive backplane 1, wherein the encapsulation structure 3 and the color resistor structure 4 are located on a side, facing away from the drive backplane 1, of the OLED device 2; and the color resistor structure 4 includes a chromatic color resistor layer 41, a first black matrix (BM) 42 and a second BM 43; and the first BM 42 is located on a side, facing away from the drive backplane 1, of the chromatic color resistor layer 41, and the second BM 43 is located on a side, facing the drive backplane 1, of the chromatic color resistor layer 41.

Figure 1:
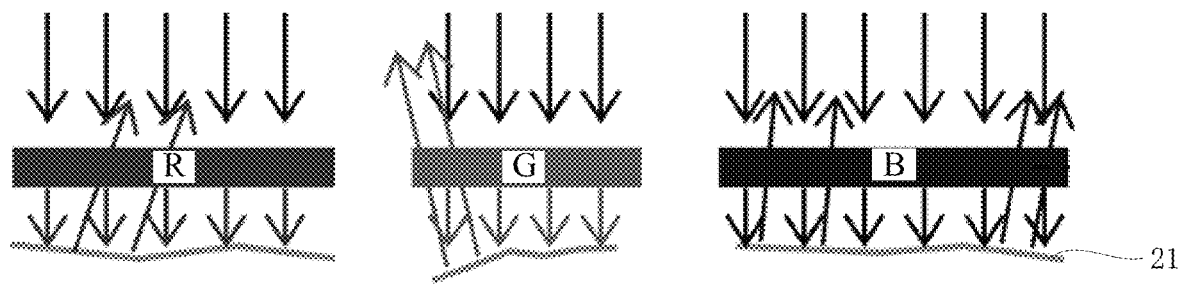
FIG. 1 is a schematic diagram of a process that external environment light is reflected by a first electrode layer in each pixel of RGB in a display panel.

Through studies, the inventor finds that electrode layers in the OLED device 2 has a smooth surface, which is equivalent to a reflecting mirror conducting directional mirror reflection on light rays; wherein first electrode layers 21 electrically connected with the drive backplane 1 is prepared on the drive backplane 1; and structures, such as a source and drain electrodes 10 arranged in the drive backplane 1, will cause a surface of a side, facing away from the drive backplane 1, of each first electrode layer 21 to be uneven. Then, as shown in FIG. 1, after external environment light is reflected by the first electrode layer 21 in each pixel of RGB, its reflected light will have different spatial distributions of reflection paths and light intensities. Therefore, white balance at a certain path or spatial angle may be destroyed, and thus different colors are seen in different positions, which will easily lead to color separation of the reflected light of the display panel in a screen-off state. In addition, an opening of the color resistor structure has a certain diffraction effect on the reflected light, which will further enhance a color separation phenomenon of the reflected light, thereby causing the display panel prepared through a CF on Encapsulation (COE) technology to have the obvious color separation phenomenon in a dark state.

In view of this finding, in the OLED display panel according to the embodiment of the present disclosure, as shown in FIG. 2 and FIG. 7, a color separation problem of the display panel in the dark state is solved by designing the color resistor structure 4 into a form of the chromatic color resistor layer 41 and two layers of BMs, and respectively arranging the two layers of BMs (the first BM 42 and the second BM 43) on the two sides of the chromatic color resistor layer 41.

In a conventional COE OLED display panel, there is only one layer of BM, and the BM is arranged on a side, facing the drive backplane, of a chromatic color resistor layer. Through studies, it is found by the inventor that the color separation phenomenon of the display panel in the dark state can be significantly weakened by adopting the two layers of BMs and arranging the two layers of BMs on the two sides of the chromatic color resistor layer respectively.

Specifically, in the OLED display panel according to the embodiment of the present disclosure, the two layers of BMs are respectively arranged on the two sides of the chromatic color resistor layer, and can be adjacent to or not adjacent to the chromatic color resistor layer. For example, referring to an arrangement shown in FIG. 2 and FIG. 7, the first BM 42, the chromatic color resistor layer 41 and the second BM 43 are arranged sequentially and adjacently; or, also referring to an arrangement shown in FIG. 4, the second BM 43 is arranged between film layers of the encapsulation structure to make the second BM 43 not adjacent to the chromatic color resistor layer.

Figure 9:
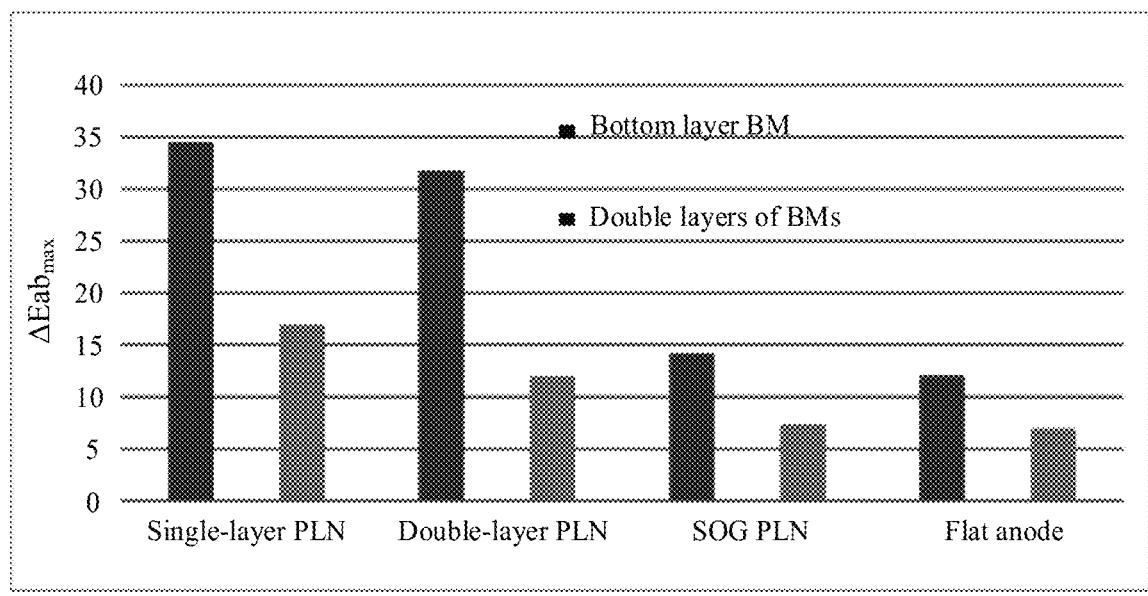
FIG. 9 is histograms of color separation degrees of various display panels with different arrangements in a dark state.

Specifically, FIG. 9 is histograms of color separation degrees of display panels in the dark state obtained according to experimental data analysis results. $\Delta Eab_{max}$ characterizes color separation degree indexes of the display panels in the dark state. In FIG. 9, there are totally four groups of histograms in a horizontal-ordinate direction, respectively characterizing experimental data results of dark-state reflected light of four specific embodiments of the display panels. In the four specific embodiments, each display panel includes a drive backplane, an OLED device, an encapsulation structure and a color resistor structure which are sequentially arranged. Each drive backplane includes a glass substrate and a thin film transistor (TFT) array located on the glass substrate, and each OLED device includes an anode, a light-emitting structure and a cathode which are sequentially arranged. Differences between the display panels of the above four specific embodiments are as follows: in embodiment a, the drive backplane includes a flat layer located on the TFT array, and the anode (i.e., first electrode layer) of the OLED device is formed on the flat layer, which is made of a conventional material of an acrylic acid series and is a single film layer (i.e., single-layer planarization (PLN)); in embodiment b, the drive backplane includes a flat layer located on the TFT array, and the anode of the OLED device is formed on the flat layer, which is made of a conventional material of an acrylic acid series and provided with two film layers (i.e., double-layer PLN); in embodiment c, the drive backplane includes a flat layer located on the TFT array, the anode of the OLED device is formed on the flat layer, which is a single film layer and is made of a material of a silicon-on-glass series (i.e., SOG PLN); and in embodiment d, the anode of the OLED device is directly formed on the glass substrate of the drive backplane, and a surface of a film layer is very flat (i.e., flat anode).

Specifically, in FIG. 9, each group of histogram has two experimental data, which are experimental data results obtained under two types of different color resistor structures respectively. Specific arrangements of the two types of different color resistor structures are respectively: A, a bottom layer black matrix (BM), that is, the color resistor structure includes a chromatic color resistor layer and a layer of BM, the BM is located on a side, facing the drive backplane, of the chromatic color resistor layer, and the color resistor structure is a color resistor structure of the conventional COE OLED display panel; and B, double layers of BMs, that is, the color resistor structure includes a chromatic color resistor layer and two layers of BMs, the two layers of BMs are respectively arranged on the two sides of the chromatic color resistor layer, and the color resistor structure is a color resistor structure of the OLED display panel of the embodiment of the present disclosure.

As shown in FIG. 9, by comparing the two pieces of data A and B in the four groups of histograms, it can be seen that $\Delta Eab_{max}$ of data B in each group of the experimental data is significantly lowered relative to data A, wherein $\Delta Eab_{max}$ of the data B in the histograms of the groups a, c and d is roughly ½ that of the data A in the histograms of the groups a, c and d, and $\Delta Eab_{max}$ of the data B in the histogram of the group b is even close to ⅓ that of the data A in the histogram of the group b. From the above data results, it can be directly concluded that an arrangement of the double layers of BMs can significantly reduce the color separation degree of the reflected light of the display panel in the dark state compared with an arrangement of the bottom layer BM; in other words, compared with a conventional arrangement of only one layer of BM arranged on the side, facing the drive backplane, of the chromatic color resistor layer, the arrangement that the double layers of BMs are respectively arranged on the two sides of the chromatic color resistor layer can effectively reduce the color separation degree of the reflected light of the display panel in the dark state. So, it can be verified that the display panel of the embodiment of the present disclosure can significantly reduce the color separation degree of the reflected light in the dark state.

In a specific embodiment, as shown in FIG. 3 to FIG. 8, in the OLED display panel according to the embodiment of the present disclosure, the side, facing away from the drive backplane 1, of the OLED device 2 is provided with at least one scattering layer 6, and the at least one scattering layer 6 includes an organic material film and scattering particles (also called light diffusion particles) 61 arranged in the organic material film. Optionally, the scattering particles can be evenly distributed in the organic material film.

In the OLED display panel according to the embodiment of the present disclosure, the scattering layer 6 is arranged on a light emergent side of the OLED device 2, the scattering particles 61 in the scattering layer 6 can scatter light rays to make a spatial distribution of paths or light intensities of reflected light in each pixel more even, and thus, the color separation phenomenon caused by directional reflection of a first electrode layer 21 can be weakened, thereby implementing an effect of further relieving the color separation phenomenon of the display panel.

Optionally, the scattering particles 61 may be inorganic scattering particles, and the inorganic scattering particles may be mixtures of one or more of zirconium oxide, silicon oxide, calcium carbonate, barium sulfate and titanium oxide, and specifically may be mixed by powder of different materials.

Optionally, particle sizes of the inorganic scattering particles may be 40 nm to 700 nm, and a mass percent of the inorganic scattering particles in the organic material film is 1% to 15%.

Optionally, the scattering particles 61 may be organic scattering particles, and the organic scattering particles may be mixtures of one or more of SOG microspheres, polyacrylic acid series microspheres, polymethyl methacrylate (PMMA) microspheres, polystyrene (PS) microspheres, etc. A refractive index of the organic scattering particles is less than a refractive index of the organic material film.

Optionally, a refractive index ratio of the organic scattering particles to the organic material film is 0.7 to 0.99, and specifically their refractive indexes may be 1.2 to 1.6; and further optionally, a mass percent of the organic scattering particles in the organic material film is 5% to 40%.

Figure 3:
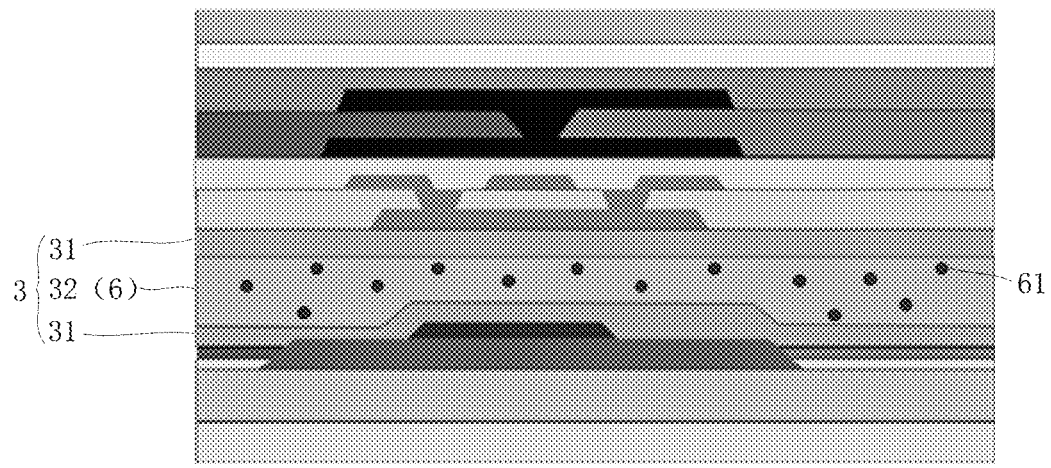
FIG. 3 is a schematic cross-sectional structural diagram of a display panel according to another embodiment of the present disclosure.

In a specific implementation, as shown in FIG. 2, FIG. 3 and FIG. 7, the encapsulation structure 3 includes two inorganic insulating layers 31 and a first organic insulating layer 32 located between the two inorganic insulating layers 31.

Optionally, as shown in FIG. 3, the first organic insulating layer 32 is configured as the scattering layer 6, that is, the first organic insulating layer 32 includes an organic material film and scattering particles 61 arranged in the organic material film.

Of course, the encapsulation structure 3 is not limited to the above three layers only, but also may be an alternating structure of three or more layers of organic and inorganic layers.

Figure 4:
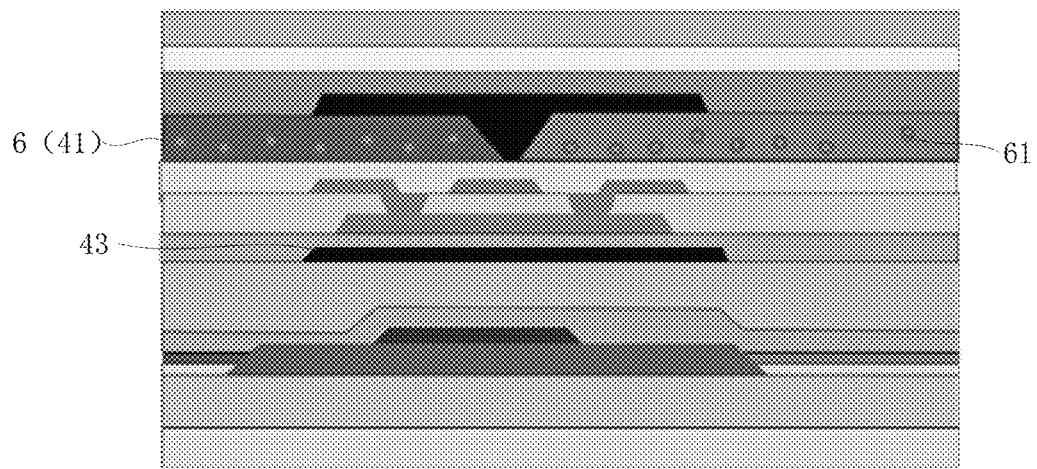
FIG. 4 is a schematic cross-sectional structural diagram of a display panel according to another embodiment of the present disclosure.

In a specific implementation, as shown in FIG. 2, FIG. 4 and FIG. 7, the color resistor structure 4 includes a chromatic color resistor layer 41.

Optionally, as shown in FIG. 4, the chromatic color resistor layer 41 is configured as the scattering layer 6, that is, the chromatic color resistor layer 41 includes an organic material film and scattering particles 61 arranged in the organic material film.

By way of example, the chromatic color resistor layer 41 specifically includes a red color resistor, a green color resistor and a blue color resistor. Specifically, particle sizes of the scattering particles 61 respectively included in the red color resistor, the green color resistor and the blue color resistor may be sequentially reduced, and specifically can be matched with a wavelength of emergent light of all the color resistors. For example, the particle sizes of the scattering particles 61 included in the red color resistor may be ⅕ λ, to 1λ, wherein λ is a wavelength of red light; and sizes of the scattering particles 61 in the green color resistor and the blue color resistor are set in a similar way. In this way, when meeting the scattering particles 1, the light in each color can be not only scattered, but also diffracted, and thus, evenness of the spatial distribution of the paths or the light intensities of the reflected light in each pixel are further improved so as to further relieve the color separation phenomenon of the display panel.

In a specific implementation, as shown in FIG. 7, the display panel of the embodiment of the present disclosure may include a second organic insulating layer 71 located between the encapsulation structure 3 and the color resistor structure 4. The second organic insulating layer 71 is configured as the scattering layer 6, that is, the second organic insulating layer includes an organic material film and scattering particles 61 arranged in the organic material film.

Figure 6:
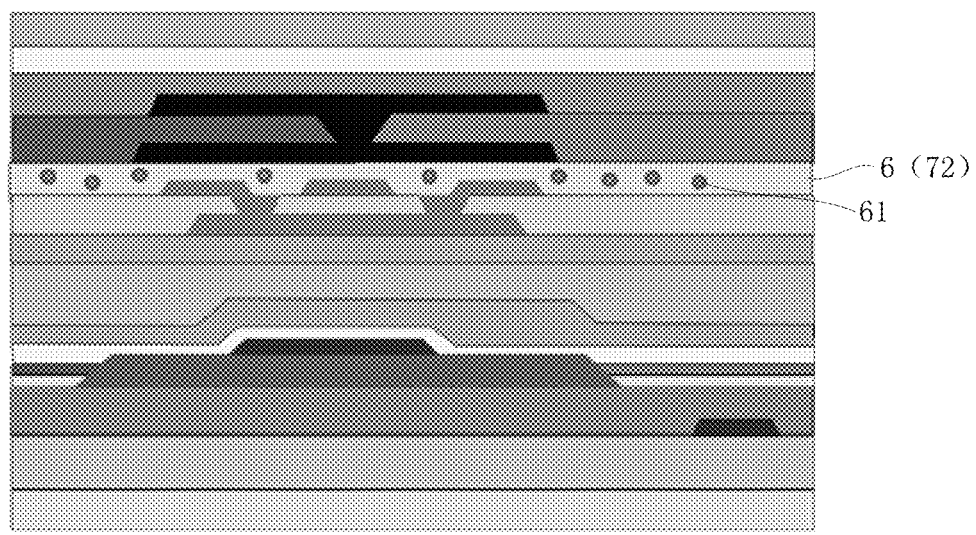
FIG. 6 is a schematic cross-sectional structural diagram of a display panel according to another embodiment of the present disclosure.
Figure 8:
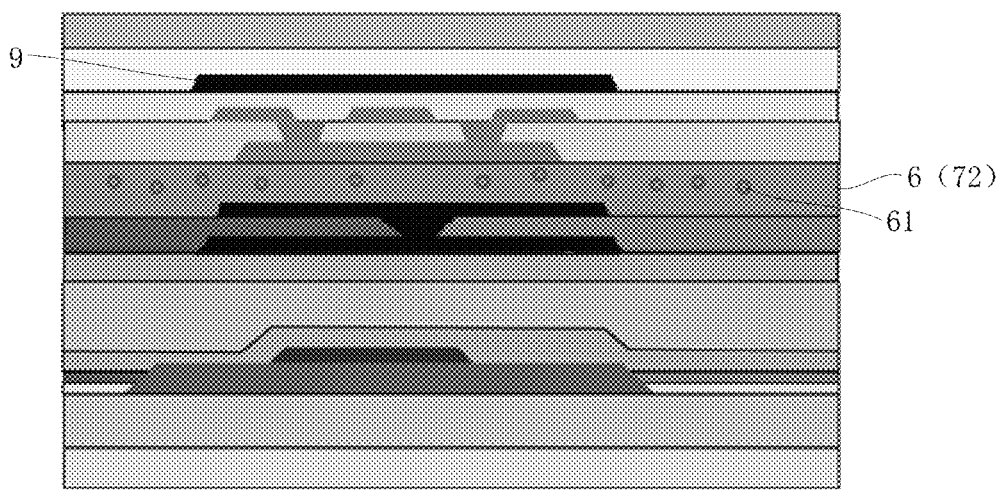
FIG. 8 is a schematic cross-sectional structural diagram of a display panel according to another embodiment of the present disclosure.

In a specific implementation, as shown in FIG. 2, FIG. 6 and FIG. 8, the OLED display panel according to the embodiment of the present disclosure may further include a touch control structure 5 located on a side, facing away from the drive backplane 1, of the encapsulation structure 3, and a third organic insulating layer 72 located between the touch control structure 5 and the color resistor structure 4.

By way of example, the touch control structure 5 can be arranged between the color resistor structure 4 and the encapsulation structure 3, referring to FIG. 2 to FIG. 6 specifically; or, the touch control structure 5 can also be arranged on the side, facing away from the encapsulation structure 3, of the color resistor structure 4, referring to FIG. 7 and FIG. 8 specifically.

By way of example, as shown in FIG. 6 and FIG. 8, the third organic insulating layer 72 is configured as the scattering layer 6, that is, the third organic insulating layer 72 includes an organic material film and scattering particles 61 arranged in the organic material film.

By way of example, as shown in FIG. 2 and FIG. 7, the touch control structure 5 includes two layers of touch control electrodes 51 and a fourth organic insulating layer 52 located between the two layers of touch control electrodes 51.

Optionally, the fourth organic insulating layer 52 can also be configured as the scattering layer 6, that is, the fourth organic insulating layer 52 includes an organic material film and scattering particles 61 arranged in the organic material film.

By way of example, the two layers of touch control electrodes 51 are respectively two layers, i.e., a drive electrode layer and an induction electrode layer prepared from metal.

In a specific implementation, as shown in FIG. 7 and FIG. 8, when the touch control structure 5 is located on the side, facing away from the encapsulation structure 3, of the color resistor structure 4, the display panel according to the embodiment of the present disclosure can further include a third BM 9 located on the side, facing away from the drive backplane 1, of the touch control structure 5. Specifically, the third BM 9 can block emergence of light rays reflected by the touch control electrodes to lower reflection of the display panel to external environment light.

Figure 5:
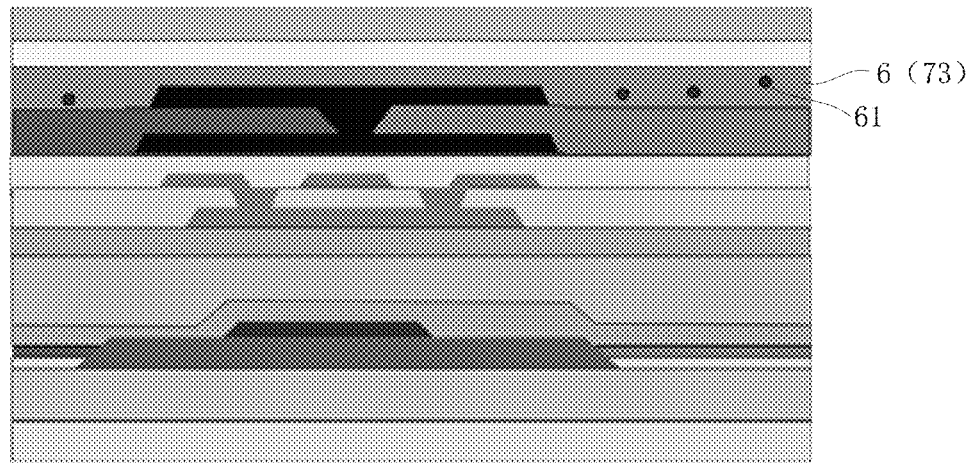
FIG. 5 is a schematic cross-sectional structural diagram of a display panel according to another embodiment of the present disclosure.

In a specific implementation, as shown in FIG. 2, FIG. 5 and FIG. 7, the OLED display panel according to the embodiment of the present disclosure further includes a fifth organic insulating layer 73 located on a farthest side, facing away from the drive backplane 1, of the color resistor structure 4 and the touch control structure 5.

By way of example, as shown in FIG. 5, the fifth organic insulating layer 73 can be configured as the scattering layer 6, that is, the fifth organic insulating layer 73 includes an organic material film and scattering particles 61 arranged in the organic material film.

In a specific embodiment, as shown in FIG. 2, the OLED device 2 includes a first electrode layer 21 electrically connected with the drive backplane 1, and a surface of a side, facing away from the drive backplane 1, of the first electrode layer 21 is a rough surface.

In the OLED display panel according to the embodiment of the present disclosure, the surface of the side, facing away from the drive backplane 1, of the first electrode layer 21 is arranged into the rough surface, and thus its surface is no longer smooth, so that the first electrode layer 21 diffusely reflects light rays instead of reflecting it directionally. In this way, unevenness of a spatial distribution of paths or light intensities of the reflected light of each pixel of RGB can be reduced, thereby implementing the technical effects of weakening the color separation phenomenon of the display panel in the dark state and relieving the color separation problem of the display panel.

In a specific embodiment, as shown in FIG. 2, the drive backplane 1 includes a flat layer 12 facing the OLED device 2, and the first electrode layer 21 of the OLED device 2 is arranged on the flat layer 12.

Specifically, the drive backplane 1 generally includes an underlayer substrate 11 and a TFT array manufactured on the underlayer substrate 11, the flat layer 12 is arranged on the TFT array, and the first electrode layer 21 is generally prepared on the flat layer 12 through a magnetron sputtering process and electrically connected with the TFT array through a via hole in the flat layer 12.

By way of example, a surface of the flat layer 12 is configured as a rough surface to further make a surface of the first electrode layer 21 prepared on the flat layer 12 rough.

By way of example, the first electrode layer 21 may be an anode, and the OLED device 2 further includes a light-emitting structure layer 22 and a transparent cathode 23.

In a specific embodiment, the flat layer 12 may include two film layers, that is, the two film layers are formed through two times of preparation processes to complete manufacturing of the flat layer 12, the surface of the flat layer 12 formed in this way may be flatter, thus the surface of the first electrode layer 21 formed on the flat layer 12 may be flatter, and a concave-convex degree of the surface is reduced, thereby weakening the color separation phenomenon of the reflected light in the dark state.

Further, the flat layer 12 is made of a material of an SOG series. Similarly, as for the flat layer 12 prepared from the material of the SOG series, the surface will be flatter so that the surface of the first electrode layer 21 can be flatter, thereby implementing the effect of weakening the color separation phenomenon of the reflected light in the dark state.

By way of example, the flat layer 12 can also be made of materials of an acrylic acid series, an epoxy resin series, etc., which is not described in detail herein.

Specifically, in order to more intuitively reflect the improving effect of the display panel according to the embodiments of the present disclosure on the color separation phenomenon in the dark state, experimental data results of dark-state reflected light under four specific embodiments of the display panel are given in FIG. 9. Specifically, as shown in FIG. 9, there are totally four groups of histograms in a horizontal-ordinate direction, which respectively characterize the experimental data results of the dark-state reflected light under the following four specific embodiments: in embodiment a, the first electrode layer of the OLED device is arranged on the flat layer, and the flat layer is a single film layer (single-layer PLN); in embodiment b, the first electrode layer of the OLED device is arranged on the flat layer, and the flat layer is provided with two film layers (double-layer PLN); in embodiment c, the first electrode layer of the OLED device is arranged on the flat layer, and the flat layer is made of a material of a silicon-on-glass series (SOG PLN); and in embodiment d, the first electrode layer of the OLED device is directly arranged on a flat underlayer (flat anode). Each group of histogram has two pieces of experimental data (bottom layer BM and double layers of BMs), which respectively correspond to two types of different color resistor structures.

As shown in FIG. 9, by respectively comparing the histograms of groups b, c, d with group a (comparing data of the same color resistor structure), it can be seen that $\Delta Eab_{max}$ of the histograms of the groups b, c and d are all significantly lowered compared with $\Delta Eab_{max}$ of the group a, wherein $\Delta Eab_{max}$ in the histograms of the groups c and d is respectively even less than ½ of $\Delta Eab_{max}$ of the group a. Thus, it can be concluded that compared with the conventional arrangement of single-layer PLN for the display panel, the forms of arranging PLN into double film layers and selecting a material of an SOG series to prepare the PLN, or other forms capable of making the surface of the anode flat all can effectively reduce the color separation degree of the reflected light of the display panel in the dark state, so that the flatter the surface of the anode is, the better the effect of reducing the color separation degree is. In conclusion, it can be intuitively concluded from the experimental data analysis results that the display panel according to the embodiments of the present disclosure can significantly reduce the color separation degree of the reflected light in the dark state.

By way of example, the OLED display panel according to the embodiments of the present disclosure is a flexible and foldable display panel, and the underlayer substrate of the drive backplane is a flexible substrate.

By way of example, the OLED display panel according to the embodiments of the present disclosure, as shown in FIG. 2, may further include other film layer structures, such as an upper protective layer 81 and a lower protective layer 82, in addition to the drive backplane 1, the OLED device 2, the encapsulation structure 3, the touch control structure 5 and the color resistor structure 4, which is not described herein.

In addition, an embodiment of the present disclosure further provides a display device, including the OLED display panel according to any one of the above.

By way of example, the display device according to the embodiment of the present disclosure may be products of a smartphone, a tablet computer, a display, etc.

Although the preferred embodiments of the present disclosure have been described, those of skill in the art may make additional changes and modifications to these embodiments once underlying creative concepts are known. So, the attached claims are intended to be construed to include the preferred embodiments and all the changes and modifications falling within the scope of the present disclosure.

Apparently, those of skill in the art may make various modifications and variations to the embodiments of the present disclosure without departing from the spirit and scope of the embodiments of the present disclosure. In this way, if these modifications and variations of the embodiments of the present disclosure fall within the scope of the claims of the present disclosure and their equivalent technologies, the present disclosure also intends to include these modifications and variations.

What is claimed is:

1. An organic light-emitting diode (OLED) display panel, comprising:
    a drive backplane; and
    an OLED device, an encapsulation structure and a color resistor structure which are arranged on the drive backplane; wherein
    the OLED device comprises a first electrode layer electrically connected with the drive backplane, a light-emitting structure layer and a cathode, and a surface of a side, facing away from the drive backplane, of the first electrode layer is a rough surface;
    the encapsulation structure and the color resistor structure are arranged on a side, facing away from the drive backplane, of the OLED device;
    the color resistor structure comprises a chromatic color resistor layer, a first black matrix BM) and a second BM; and
    the first BM is arranged on a side, facing away from the drive backplane, of the chromatic color resistor layer, and the second BM is arranged on a side, facing the drive backplane, of the chromatic color resistor layer.

2. The OLED display panel according to claim 1, wherein the side, facing away from the drive backplane, of the OLED device is provided with at least one scattering layer; and
    the at least one scattering layer comprises an organic material film and scattering particles arranged in the organic material film.

3. The OLED display panel according to claim 2, wherein the encapsulation structure comprises two inorganic insulating layers and a first organic insulating layer arranged between the two inorganic insulating layers; and
    the first organic insulating layer is configured as the scattering layer.

4. The OLED display panel according to claim 2, wherein the chromatic color resistor layer is configured as the scattering layer.

5. The OLED display panel according to claim 4, wherein the chromatic color resistor layer comprises a red color resistor, a green color resistor and a blue color resistor; and
    particle sizes of scattering particles respectively contained in the red color resistor, the green color resistor and the blue color resistor are sequentially reduced.

6. The OLED display panel according to claim 2, further comprising:
    a second organic insulating layer arranged between the encapsulation structure and the color resistor structure;
    wherein the second organic insulating layer is configured as the scattering layer.

7. The OLED display panel according to claim 2, further comprising:
    a touch control structure arranged on a side, facing away from the drive backplane, of the encapsulation structure;

wherein the touch control structure is arranged between the encapsulation structure and the color resistor structure, or the touch control structure is arranged on a side, facing away from the drive backplane, of the color resistor structure.

8. The OLED display panel according to claim 7, further comprising:
a third organic insulating layer arranged between the touch control structure and the color resistor structure;
wherein the third organic insulating layer is configured as the scattering layer.

9. The OLED display panel according to claim 7, wherein the touch control structure comprises two layers of touch control electrodes and a fourth organic insulating layer arranged between the two layers of touch control electrodes; and
the fourth organic insulating layer is configured as the scattering layer.

10. The OLED display panel according to claim 7, further comprising:
a fifth organic insulating layer arranged on a farthest side, facing away from the drive backplane, of the touch control structure and the color resistor structure;
wherein the fifth organic insulating layer is configured as the scattering layer.

11. The OLED display panel according to claim 2, wherein the scattering particles are inorganic scattering particles; and
the inorganic scattering particles are mixtures of one or more of titanium oxide, zirconium oxide, silicon oxide, calcium carbonate and barium sulfate.

12. The OLED display panel according to claim 11, wherein particle sizes of the inorganic scattering particles are 40 nm to 700 nm, and
a mass percent of the inorganic scattering particles in the organic material film is 1% to 15%.

13. The OLED display panel according to claim 2, wherein the scattering particles are organic scattering particles,
a refractive index ratio of the organic scattering particles to the organic material film is 0.7 to 0.99, and
a mass percent of the organic scattering particles in the organic material film is 5% to 40%.

14. The OLED display panel according to claim 1, comprising:
the touch control structure,
wherein the touch control structure is arranged on a side, facing away from the drive backplane, of the color resistor structure;
wherein display panel further comprises: a third BM arranged on the side, facing away from the drive backplane, of the touch control structure.

15. The OLED display panel according to claim 1, wherein the drive backplane comprises a flat layer facing the OLED device;
the first electrode layer of the OLED device is arranged on the flat layer; and
a surface of the flat layer is configured as a rough surface to make the surface of the first electrode layer prepared on the flat layer rough.

16. The OLED display panel according to claim 14, wherein the flat layer comprises two film layers.

17. The OLED display panel according to claim 14, wherein the flat layer is made of materials of a silicon-on-glass (SOG) series, an acrylic acid series and an epoxy resin series.

18. A display device, comprising an OLED display panel, comprising:
a drive backplane; and
an OLED device, an encapsulation structure and a color resistor structure which are arranged on the drive backplane; wherein
OLED device comprises a first electrode layer electrically connected with the drive backplane, a light-emitting structure layer and a cathode, and a surface of a side, facing away from the drive backplane, of the first electrode layer is a rough surface;
the encapsulation structure and the color resistor structure are arranged on a side, facing away from the drive backplane, of the OLED device;
the color resistor structure comprises a chromatic color resistor layer, a first black matrix (BM) and a second BM; and
the first BM is arranged on a side, facing away from the drive backplane, of the chromatic color resistor layer, and the second BM is arranged on a side, facing the drive backplane, of the chromatic color resistor layer.

* * * * *